(12) United States Patent
Fulkerson (10) Patent No.: US 7,411,411 B1
(45) Date of Patent: Aug. 12, 2008

(54) METHODS AND SYSTEMS FOR HARDENING A CLOCKED LATCH AGAINST SINGLE EVENT EFFECTS

(75) Inventor: David E Fulkerson, Chanhassen, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 11/875,605

(22) Filed: Oct. 19, 2007

(51) Int. Cl.
*H03K 19/003* (2006.01)

(52) U.S. Cl. ............................ 326/9; 326/10; 326/12

(58) Field of Classification Search ............ 326/9–10, 326/12–14
See application file for complete search history.

(56) References Cited

U.S. PATENT DOCUMENTS

| | | | |
|---|---|---|---|
| 5,311,070 A | 5/1994 | Dooley | 307/279 |
| 6,275,080 B1 | 8/2001 | Phan et al. | 327/200 |
| 6,282,140 B1 | 8/2001 | Phan et al. | 365/230.02 |
| 6,327,176 B1 | 12/2001 | Li et al. | 365/156 |
| 6,417,711 B2 | 7/2002 | Fulkerson | 327/203 |
| 6,667,520 B1 | 12/2003 | Fulkerson | 257/369 |
| 6,696,873 B2 | 2/2004 | Hazucha et al. | 327/203 |
| 6,703,858 B2 | 3/2004 | Knowles | 326/9 |
| 7,023,235 B2 | 4/2006 | Hoff | 326/10 |
| 7,071,749 B2 | 7/2006 | Gardner | 327/202 |
| 7,161,404 B2 | 1/2007 | Hazucha et al. | 327/203 |
| 7,193,451 B2 | 3/2007 | Hendrickson | 327/199 |
| 7,236,001 B2* | 6/2007 | Fulkerson | 326/12 |
| 2004/0007743 A1 | 1/2004 | Matsuda et al. | 257/369 |
| 2006/0001442 A1* | 1/2006 | Wood et al. | 326/9 |
| 2006/0267653 A1 | 11/2006 | Fulkerson | 327/208 |
| 2007/0052442 A1 | 3/2007 | Fulkerson | 326/14 |
| 2007/0069305 A1 | 3/2007 | Kuboyama et al. | 257/369 |

OTHER PUBLICATIONS

L. Heller, et al., "Cascode Voltage Switch Logic: A Differential CMOS Logic Family", IEEE Int. Conf. on Solid-State Circuits [Dig. Of Tech. Papers] vols. XXVII, Feb. 1984, pp. 16-17.

* cited by examiner

*Primary Examiner*—Anh Q Tran
(74) *Attorney, Agent, or Firm*—McDonnell Boehnen Hulbert & Berghoff LLP

(57) ABSTRACT

Methods and systems for hardening a clocked latch against single event effects are disclosed. A system includes a first three-input OR gate, a first NAND gate, a second three-input OR gate, and a second NAND gate. The first three-input OR gate receives as inputs a clock signal, a first signal, and a redundant first signal. An output of the first three-input OR gate is connected to an input of the first NAND gate. The second three-input OR gate receives as inputs the clock signal, a second signal, and a redundant second signal. An output of the second three-input OR gate is connected to an input of the second NAND gate. A first output signal of the first NAND gate is connected to another input of the second NAND gate and a second output signal of the second NAND gate is connected to another input of the first NAND gate.

20 Claims, 9 Drawing Sheets

| 102 | 104 | 110 | 112 |
|---|---|---|---|
| 0 | 0 | restricted | |
| 0 | 1 | 1 | 0 |
| 1 | 0 | 0 | 1 |
| 1 | 1 | maintain state | |

| D | DB | D* | DB* | C | E | F | (322) Q | (344) QB |
|---|----|----|-----|---|---|---|---------|----------|
| 0 | 1  | 0  | 1   | 0 | 0 | 1 | 1       | 0        |
| 0 | 1  | 0  | 1   | 1 | 1 | 1 | maintain state | |
| 1 | 0  | 1  | 0   | 0 | 1 | 0 | 0       | 1        |
| 1 | 0  | 1  | 0   | 1 | 1 | 1 | maintain state | |

| A | B | D | DB |
|---|---|---|----|
| 0 | 0 | 1 | 0 |
| 0 | 1 | 1 | 0 |
| 1 | 0 | 1 | 0 |
| 1 | 1 | 0 | 1 |

FIGURE 9

METHODS AND SYSTEMS FOR HARDENING A CLOCKED LATCH AGAINST SINGLE EVENT EFFECTS

FIELD

The present invention relates generally to integrated circuits and, more particularly, relates to redundancy circuits that are hardened against single event effects.

BACKGROUND

A latch is an electronic device that is typically used to store data. An output of a latch may depend not only on its current input, but also on its previous inputs and outputs. Latches may include any of a variety of logic devices such as NAND gates and NOR gates, and the logic gates may include semiconductor devices such as transistors.

A latch or flip-flop (or circuit, more generally) may be used in applications in which the circuit is exposed to harsh environments, such as in space and military applications. However, these circuits may be susceptible to Single Event Effects (SEE). An SEE is a disturbance in an active semiconductor device caused by a single energetic particle. As semiconductor devices become smaller and smaller, transistor threshold voltages decrease. These lower thresholds reduce the charge per node needed to cause errors. As a result, the semiconductor devices become more and more susceptible to transient upsets.

One type of SEE is a single event upset (SEU). An SEU is a radiation-induced error in a semiconductor device caused when charged particles lose energy by ionizing the medium through which they pass, leaving behind a wake of electron-hole pairs. The electron-hole pairs form a parasitic conduction path, which can cause a false transition on a node. The false transition, or glitch, can propagate through the semiconductor device and may ultimately result in the disturbance of a node containing state information, such as an output of a latch, flip-flop, or register.

An SEU may be caused in any of a variety of ways. As an example, an SEU may be caused by ionizing radiation components, such as neutrons, protons, and heavy ions. Such ionizing radiation components are abundant in space and at commercial flight altitudes. As another example, an SEU may be caused by alpha particles from the decay of trace concentrations of uranium and thorium present in some integrated circuit packaging. As yet another example, an SEU may be caused by detonating nuclear weapons. When a nuclear weapon is detonated, intense fluxes of gamma rays, x-rays, and other high-energy particles are created, and these high-energy particles may cause an SEU.

A latch or flip-flop may be susceptible to SEU in any of a variety of ways. As examples, if an input to or transistor in the latch or flip-flop changes state due to an SEU, then the latch or flip flop may produce an erroneous output.

SUMMARY

Methods and systems are provided for hardening a clocked latch against single event effects. In one aspect, an embodiment of the present invention may take the form of a system. The system includes a first three-input OR gate; a first NAND gate that (i) includes a first input and second input and (ii) produces a first output signal; a second three-input OR gate; and a second NAND gate that (i) includes a third input and fourth input and (ii) produces a second output signal. The first three-input OR gate receives as inputs a clock signal, first signal, and redundant first signal. An output of the first three-input OR gate is connected to the first input of the first NAND gate. The second three-input OR gate receives as inputs the clock signal, a second signal, and a redundant second signal. An output of the second three-input OR gate is connected to the third input of the second NAND gate. The first output signal of the first NAND gate is connected to the fourth input of the second NAND gate and the second output signal of the second NAND gate is connected to the second input of the first NAND gate.

In an example, the first signal and second signal are complementary to one another. Each of the first output signal and second output signal preferably maintains its state when any one of the first signal, redundant first signal, second signal, redundant second signal, and clock signal changes state due to an SEE.

In some examples, the system further includes a first inverter. An output of the first inverter is connected to an input of the first three-input OR gate. The first inverter receives the second signal as an input and produces the redundant first signal as an output. In other examples, the system further includes a second inverter. An output of the second inverter is connected to an input of the second three-input OR gate. The second inverter receives the first signal as an input and produces the redundant second signal as an output.

In an example, the first three-input OR gate and first NAND gate cooperatively include a first plurality of transistors. The first output signal preferably maintains its state when a transistor in the first plurality of transistors changes state due to an SEE. In another example, the second three-input OR gate and second NAND gate cooperatively include a second plurality of transistors. The second output signal preferably maintains its state when a transistor in the second plurality of transistors changes state due to an SEE.

In some examples, the first three-input OR gate and first NAND gate cooperatively include first, second, third, fourth, fifth, sixth, seventh, eighth, ninth, and tenth transistors. A second terminal of the first transistor is connected to a first voltage supply; a first terminal of the first transistor is connected to a second terminal of the second transistor; a first terminal the second transistor is connected to a second terminal of the third transistor; a first terminal of the third transistor is connected to a signal line that includes the first output signal; a second terminal of the fourth transistor is connected a second voltage supply; a first terminal of the fourth transistor is connected to a second terminal of the fifth transistor; and the first terminal of the fifth transistor is connected to the signal line.

A first terminal of each of the sixth, ninth, and tenth transistors is connected to the signal line; a second terminal of each of the sixth, ninth, and tenth transistors is connected to a first terminal of the seventh transistor; a second terminal of the seventh transistor is connected to a first terminal of the eighth transistor; and a second terminal of the eighth transistor is connected to ground.

A third terminal of each of the first and sixth transistors is connected to the first signal; a third terminal of each of the second and ninth transistors is connected to the redundant first signal; a third terminal of each of the third and tenth transistors is connected to the clock signal; and a third terminal of each of the fourth, fifth, seventh, and eighth transistors is connected to the second output signal.

In an example, the first voltage supply includes the second voltage supply. The first output signal preferably remains substantially constant when any one of the first, second, third, fourth, fifth, sixth, seventh, eighth, ninth, and tenth transistors changes state due to an SEE.

In other examples, the second three-input OR gate and second gate cooperatively include first, second, third, fourth, fifth, sixth, seventh, eighth, ninth, and tenth transistors. A second terminal of the first transistor is connected to a first voltage supply; a first terminal of the first transistor is connected to a second terminal of the second transistor; a first terminal the second transistor is connected to a second terminal of the third transistor; a first terminal of the third transistor is connected to a signal line that includes the second output signal; a second terminal of the fourth transistor is connected to a second voltage supply; a first terminal of the fourth transistor is connected to a second terminal of the fifth transistor; and the first terminal of the fifth transistor is connected to the signal line.

A first terminal of each of the sixth, ninth, and tenth transistors is connected to the signal line; a second terminal of each of the sixth, ninth, and tenth transistors is connected to a first terminal of the seventh transistor; a second terminal of the seventh transistor is connected to a first terminal of the eighth transistor; and a second terminal of the eighth transistor is connected to ground.

A third terminal of each of the first and sixth transistors is connected to the second signal; a third terminal of each of the second and ninth transistors is connected to the redundant second signal; a third terminal of each of the third and tenth transistors is connected to the clock signal; and a third terminal of each of the fourth, fifth, seventh, and eighth transistors is connected to the first output signal.

In an example, the first voltage supply includes the second voltage supply. The second output signal preferably remains substantially constant when any one of the first, second, third, fourth, fifth, sixth, seventh, eighth, ninth, and tenth transistors changes state due to an SEE.

In one example, the system further includes a cascade-voltage-switch-logic (CVSL) NAND/AND gate that produces the first signal and second signal. The CVSL, logic includes first, second, third, fourth, fifth, and sixth transistors. A second terminal of the first transistor is connected to a first voltage supply; a third terminal of the first transistor is connected to a second signal line that includes the second signal; a first terminal of the first transistor is connected to a first signal line that includes the first signal; a second terminal of the second transistor is connected to a second voltage supply; a third terminal of the second transistor is connected to the first signal line; and a first terminal of the second transistor is connected to the second signal line. And a first terminal of the third transistor is connected to the first signal line; a third terminal of the third transistor is connected to a third signal; a second terminal of the third transistor is connected to a first terminal of the fourth transistor; a third terminal of the fourth transistor is connected to a fourth signal; a second terminal of the fourth transistor is connected to a first ground; a first terminal of each of the fifth and sixth transistors is connected to the second signal line; a third terminal of the fifth transistor is connected to a fifth signal; a third terminal of the sixth transistor is connected to a sixth signal; a second terminal of the fifth transistor is connected to a second ground; and a second terminal of the sixth terminal is connected to a third ground.

In an example, the first voltage supply includes the second voltage supply. In another example, the first ground includes the second and third grounds. In yet another example, the third signal and fifth signal are complementary to one another and the fourth signal and sixth signal are complementary to one another.

In another aspect, an embodiment of the present invention may take the form of a method. The method includes providing a first signal, redundant first signal, and clock signal to a first three-input OR gate; providing an output of the first three-input OR gate to a first input of a first NAND gate; providing a second signal, redundant second signal, and the clock signal to a second three-input OR gate; providing an output of the second three-input OR gate to a first input of a second NAND gate; providing an output signal of the first NAND gate to a second input of the second NAND gate; and providing an output signal of the second NAND gate to a second input of the first NAND gate.

In an example, providing the redundant first signal to the first three-input OR gate includes providing the second signal to a first inverter and providing an output of the first inverter to an input of the first three-input OR gate. In another example, providing the redundant second signal to the second three-input OR gate includes providing the first signal to a second inverter and providing an output of the second inverter to an input of the second three-input OR gate.

Each of the first output signal and second output signal preferably maintains its state when any one of the first signal, redundant first signal, second signal, redundant second signal, and clock signal changes state due to an SEE.

In yet another aspect, an embodiment of the present invention may take the form of another system. The system includes a first three-input OR gate that receives as inputs a first signal, a redundant first signal, and a clock signal; a second three-input OR gate that receives as inputs a second signal, a redundant second signal, and the clock signal; and a NAND-based latch that receives as inputs an output of the first three-input OR gate and an output of the second three-input OR gate.

These as well as other aspects and advantages will become apparent to those of ordinary skill in the art by reading the following detailed description, with appropriate reference to the accompanying drawings.

BRIEF DESCRIPTION OF THE DRAWINGS

Various embodiments are described herein with reference to the following drawings, wherein like numerals denote like entities.

DETAILED DESCRIPTION

1. System Architecture

Figure 1:
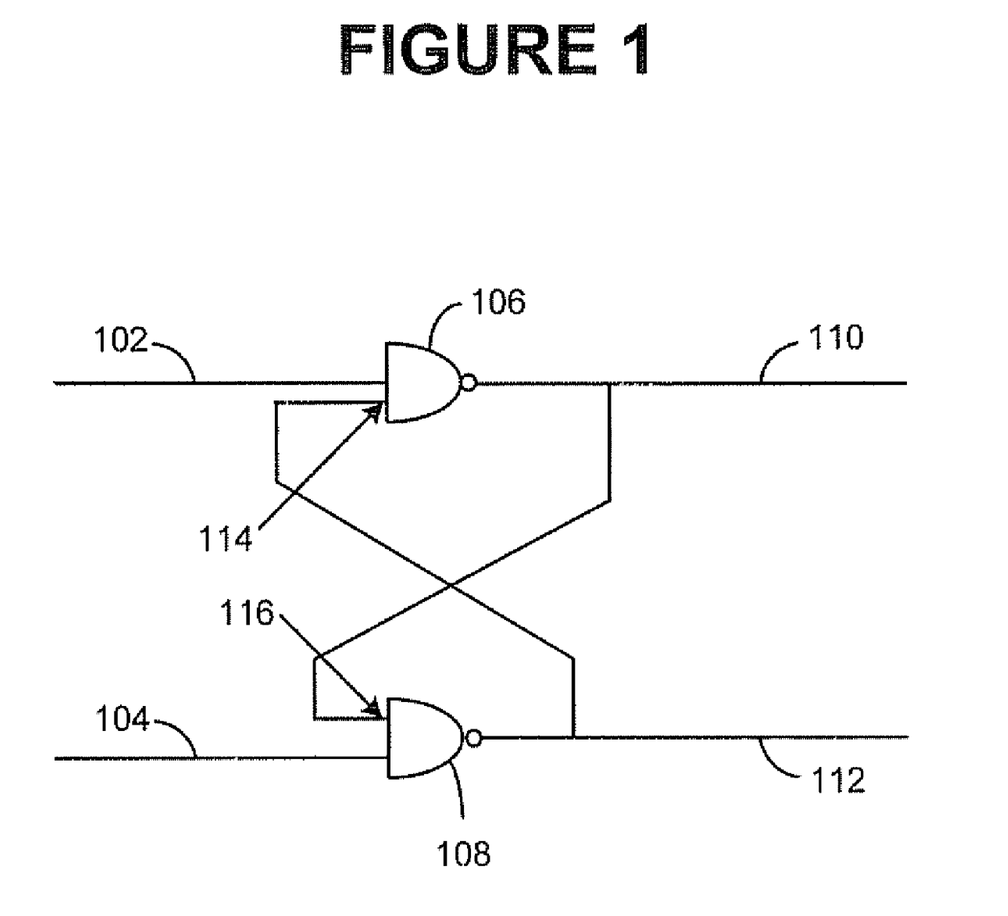
FIG. 1 is a block diagram of a NAND-based latch, according to an example.

FIG. 1 depicts a NAND-based latch 100, according to an example. The NAND-based latch 100 includes inputs 102 and 104, NAND gate 106, NAND gate 108, and outputs 110 and 112. As shown, the output 110 is connected to an input 116 of the NAND gate 108 and the output 112 is connected to an input 114 of the NAND gate 106. The outputs 110 and 112 are preferably complementary to one another.

Figure 2:
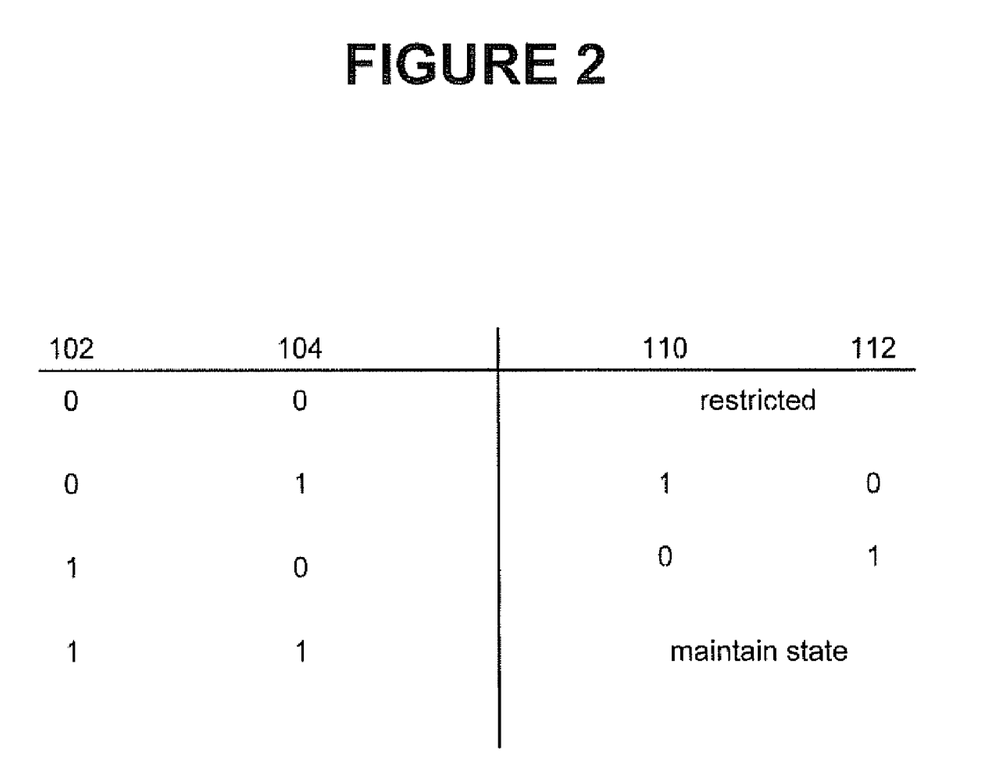
FIG. 2 is a truth table corresponding to the NAND-based latch of FIG. 1, according to an example.

FIG. 2 depicts a truth table 200 corresponding to the NAND-based latch 100, according to an example. As shown by the truth table 200, when the inputs 102 and 104 are each a logic "1", each of the outputs 110 and 112 maintains its state.

However, the NAND-based latch 100 may be susceptible to an SEU in any of a variety of ways. As an example, if the input 102 or 104 changes state to due to an SEU, then the output 110 and/or 112 may change state and thus cause an error. For example, if input 102 is a logic "0" and input 104 is a logic "1", then the output 110 is a logic "1" and the output 112 is a logic "0". If the input 102 transitions to a logic "1" and the input 104 transitions to a logic "0", then the output 110 is a logic "0" and the output 112 is a logic "1". But if the input 104 changes state due to an SEU during the transition, then the input 104 may remain a logic "1" after the transition. Since the input 102 is a logic "1" after the transition and the input 104 is a logic "1" due to the SEU, the outputs 110 and 112 may incorrectly remain as a logic "1" and "0", respectively. Hence, if the input 102 or 104 changes state due to an SEU, then the output 110 and/or 112 may change state and thus cause an error.

As another example, the NAND gate 106 may include a plurality of transistors (not shown). If a transistor within the NAND gate 106 changes state due to an SEU, then the output 110 may change state and thus cause an error. Similarly, the NAND gate 108 may include a plurality of transistors (not shown). If a transistor within the NAND gate 108 changes state due to an SEU, then the output 112 may change state and thus cause an error.

Figure 3:
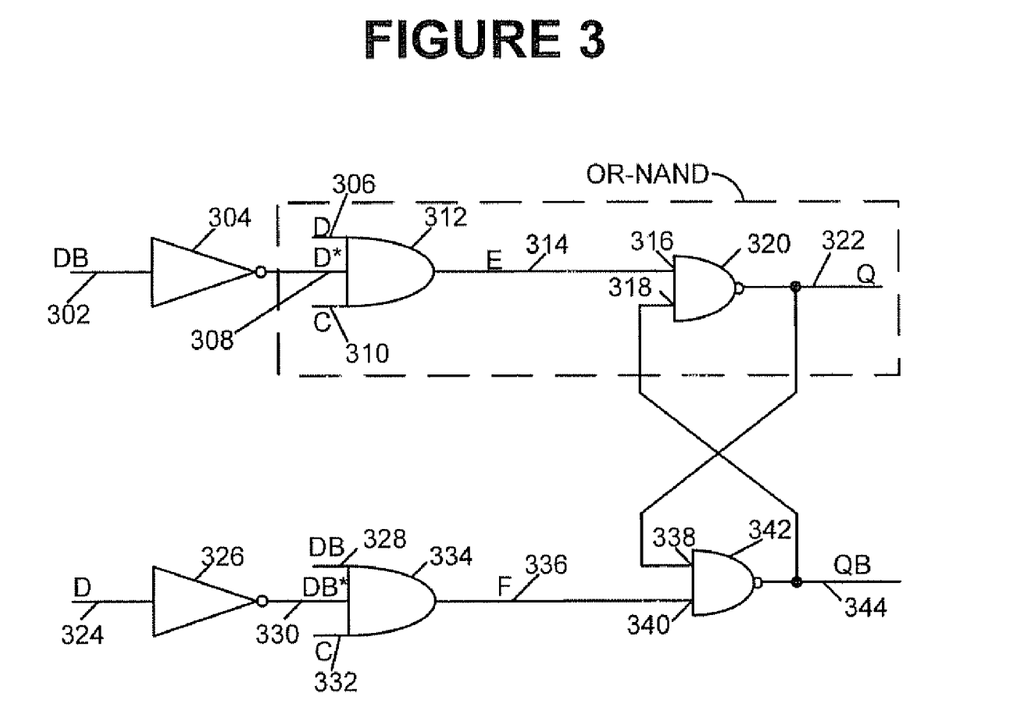
FIG. 3 is a block diagram of a radiation-hardened clocked latch, according to an example.

FIG. 3 is a block diagram of a radiation-hardened clocked latch 300, according to an example. As shown in FIG. 3, the radiation-hardened clocked latch 300 includes an inverter 304, a three-input OR gate 312, a NAND gate 320, an inverter 326, a three-input OR gate 334, and a NAND gate 342. The NAND gates 320 and 342 may be implemented as a NAND-based latch such as the NAND-based latch 100.

It should be understood that this and other arrangements described herein are set forth only as examples. Those skilled in the art will appreciate that other arrangements and elements (e.g., logic gates, devices, interfaces, and functions, etc.) can be used instead, and that some elements may be omitted altogether (e.g., the inverter 304 and/or 324 may be omitted). Further, many of the elements described herein are functional entities that may be implemented as discrete or distributed components or in conjunction with other components, and in any suitable combination and location. Various functions described herein as being performed by one or more entities may be carried out by hardware, firmware, and/or software. And various functions may be carried out by a processor executing instructions stored in memory.

As shown in FIG. 3, the three-input OR gate 312 receives as inputs a first signal, D, on line 306, a redundant first signal, D*, on line 308, and a clock signal, C, on line 310. The output 314 of three-input OR gate 312 is connected to an input 316 of the NAND gate 320. A first output signal, Q, of the NAND gate 320 (on line 322) is connected to an input 338 of the NAND gate 342.

The three-input OR gate 334 receives as inputs a second signal, DB (also known as D_bar, which is the complement of D), on line 328, a redundant second signal, DB*, on line 330, and the clock signal, C, on line 332. The output 336 of three-input OR gate 334 is connected to an input 340 of the NAND gate 342. A second output signal, QB (also known as Q_bar, which is the complement of Q), of the NAND gate 342 (on line 344) is connected to an input 318 of the NAND gate 320.

The clock signal on lines 310 and 332 may include the same clock signal or different clock signals. Since the radiation-hardened clocked latch 300 is clocked by the clock signal, C, on lines 310 and 332, the radiation-hardened clocked latch 300 may also be referred to as a radiation-hardened flip-flop 300. As used herein, the terms "clocked latch" and "flip-flop" are used synonymously.

The first signal, D, and redundant first signal, D*, are preferably equal to one another. And the second signal, DB, and redundant second signal, DB*, are also preferably equal to one another. Further, the first signal, D, and second signal, DB, are preferably complementary to one another.

The redundant first signal, D*, may be produced in any of a variety of ways. As an example, the redundant first signal, D*, may be produced by inverting the second signal, DB. As shown in FIG. 3, the second signal, DB, may be connected to the inverter 304 via line 302, and the output of the inverter 304 may be connected to the input 308 of the three-input OR gate 312. Of course, other examples exist for creating the redundant first signal, D*.

Similarly, the redundant second signal, DB*, may be produced in any of a variety of ways. As an example, the redundant second signal, DB*, may be produced by inverting the first signal, D. As shown in FIG. 3, the first signal may be connected to the inverter 326 via line 324, and the output of the inverter 326 may be connected to the input 330 of the three-input OR gate 334.

Figure 4:
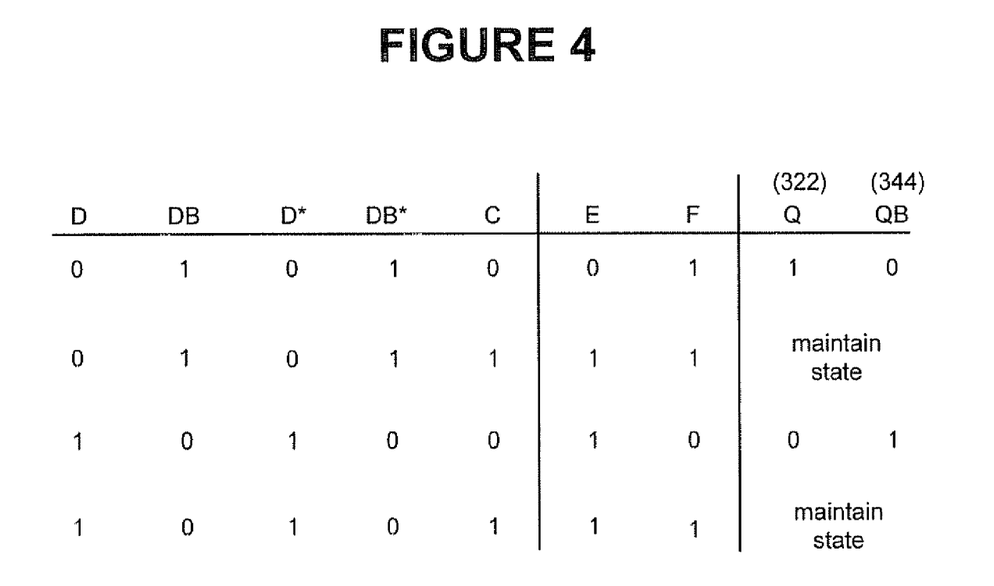
FIG. 4 is a truth table corresponding to the radiation-hardened clocked latch of FIG. 3, according to an example.

FIG. 4 is a truth table 400 corresponding to the radiation-hardened clocked latch 300, according to an example. If the clock signal, C, on lines 310 and 332 is a logic "1", then the output of each of the first and second three-input OR gates 312 and 334, respectively, is a logic "1", and each of the first and second outputs signals Q and QB, respectively, maintains its previous state. If the clock signal, C, on lines 310 and 332 is a logic "0", the first signal, D, is a logic "0", and the second signal, DB, is a logic "1", then the first output signal, Q, is a logic "1" and the second output signal, QB, is a logic "0". And if the clock signal, C, on lines 310 and 332 is a logic "0", the first signal, D, is a logic "1", and the second signal, DB, is a logic "0", then the first output signal, Q, is a logic "0" and the second output signal, QB, is a logic "1".

By providing redundant inputs (i.e., the first signal and redundant first signal, and the second signal and redundant second signal) and associated circuitry (e.g., the three-input OR gates 312 and 334 and/or inverters 304 and 326), each of the first and second output signals Q and QB, respectively, maintains its state when an SEE (e.g., an SEU) occurs to any one of the first signal, D, on line 306, redundant first signal, D*, on line 308, clock signal, C, on line 310, second signal, DB, on line 328, redundant second signal, DB*, on line 330, and clock signal, C, on line 332.

To illustrate, if the first signal, D, and second signal, DB, are equal to one another due to an SEE, then each of the outputs of the first and second three-input OR gates 312 and 334, respectively, is a logic "1", and each of the first and second output signals Q and QB, respectively, maintains its state.

Further, if the first signal, D, is a logic "0", the second signal, DB, is a logic "1", the clock signal on line 310 is a logic "0", and the clock signal on line 332 is a logic "1" due to an SEE, then each of the outputs of the three-input OR gates 312 and 334, respectively, maintains its state and, therefore, each of the first and second output signals Q and QB, respectively, maintains its state as well. On the other hand, if the first signal, D, is a logic "0", the second signal, DB, is a logic "1", the clock signal on line 332 is a logic "0", and the clock signal on line 310 is a logic "1" due to an SEE, then each of the outputs of the three-input OR gates 312 and 334, respectively, is a logic "1", and each of the first and second output signals 322 and 344, respectively, maintains its state.

Hence, by providing redundant inputs and associated circuitry, each of the first and second output signals Q and QB, respectively, maintains its state when an SEE (e.g., an SEU) occurs to any one of the first signal, D, on line 306, redundant first signal, D*, on line 308, clock signal, C, on line 310, second signal, DB, on line 328, redundant second signal, DB*, on line 330, and clock signal, C, on line 332. As such, the radiation-hardened clocked latch 300 is hardened against an SEE.

Figure 5:
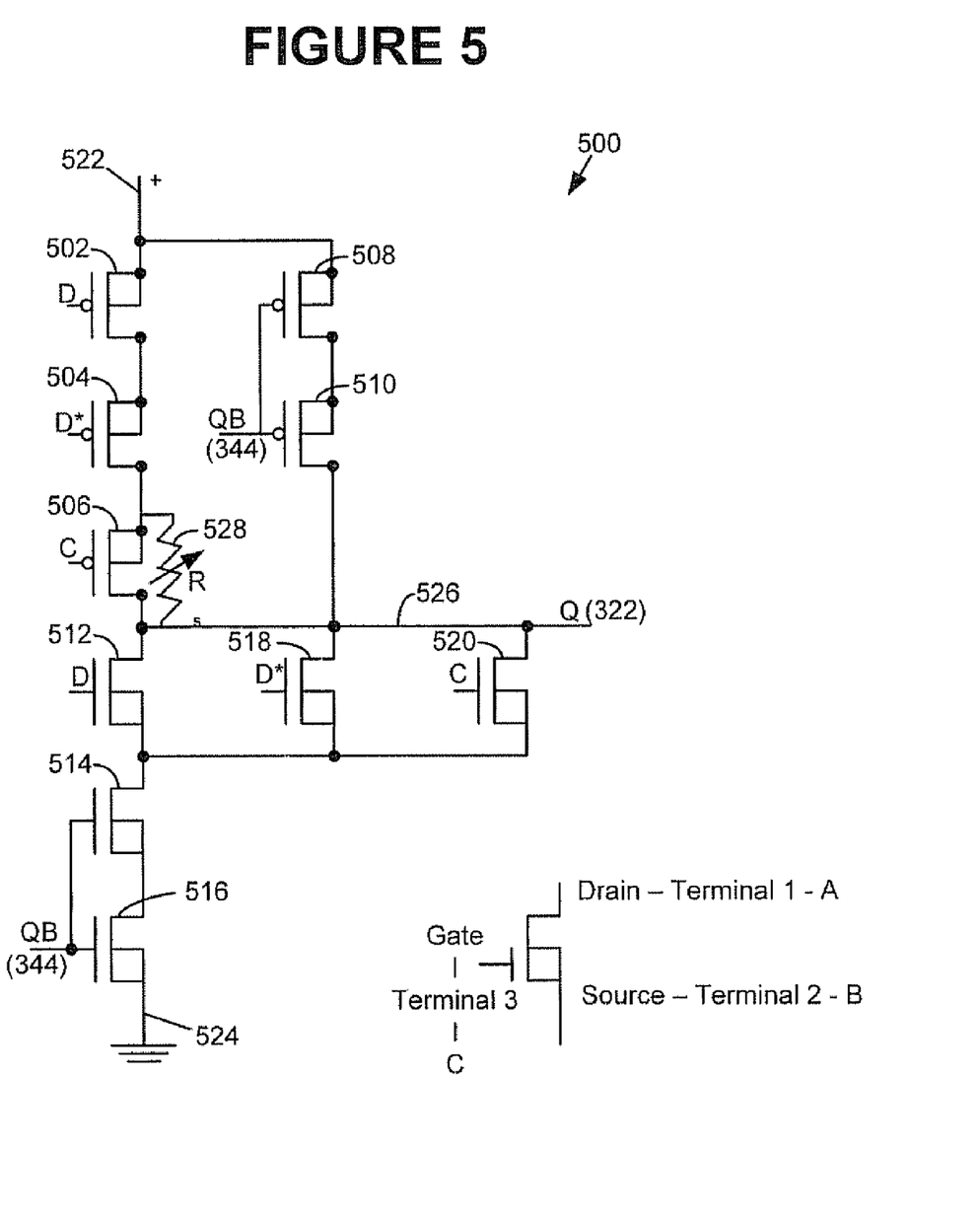
FIG. 5 is a block diagram of radiation-hardened OR-NAND transistor logic, according to an example.

Further, the three-input OR gate 312 and NAND gate 320 are preferably cooperatively radiation hardened as well. FIG. 5 is a block diagram of radiation-hardened OR-NAND transistor logic 500, according to an example. The radiation-hardened OR-NAND transistor logic 500 may be used to cooperatively implement the three-input OR gate 312 and NAND gate 320. Although illustrated to include transistors that are n-channel and p-channel MOSFETs, the radiation-hardened OR-NAND transistor logic 500 may include any of a variety of transistors such as bipolar junction transistors, FinFETs, inverted-T channel field effect transistors (IT-FETs), other field effect transistors, and other semiconductor devices, more generally.

As shown in FIG. 5, the radiation-hardened OR-NAND transistor logic 500 includes transistors 502, 504, 506, 508, 510, 512, 514, 516, 518, and 520. A terminal 502b (e.g., a source terminal) of the transistor 502 is connected to a voltage supply 522; a terminal 502a (e.g., a drain terminal) of the transistor 502 is connected to a terminal 504b of the transistor 504; a terminal 504a of the transistor 504 is connected to a terminal 506b of the transistor 506; a terminal 506a of the transistor 506 is connected to a signal line 526 that includes the first output signal, Q; a terminal 508b of the transistor 508 is connected the voltage supply 522 (or a separate voltage supply); a terminal 508a of the transistor 508 is connected to a terminal 510b of the transistor 510; and the terminal 510a of the transistor 510 is connected to the signal line 526.

Terminals 512a, 518a, and 520a of the transistors 512, 518, and 520, respectively, are connected to the signal line 526; terminals 512b, 518b, and 520b of the transistors 512, 518, and 520, respectively, are connected to terminal 514a of the transistor 514; terminal 514b of the transistor 514 is connected to terminal 516a of the transistor 516; and terminal 516b of the transistor 516 is connected to ground 524.

Further, terminals 502c (e.g., a gate terminal) and 512c of the transistors 502 and 512, respectively, are connected to the first signal, D; terminals 504c and 518c of the transistors 504 and 518, respectively, are connected to the redundant first signal, D*; terminals 506c and 520c of the transistors 506 and 520, respectively, are connected to the clock signal, C; and terminals 508c, 510c, 514c, and 516c of the transistors 508, 510, 514, and 516, respectively, are connected to the second output signal, QB.

As noted, the radiation-hardened OR-NAND transistor logic 500 is preferably radiation hardened. To illustrate, suppose the first signal, D, is a logic "0", the redundant first signal, D*, is a logic "0", the clock signal, C, is a logic "1", the first output signal, Q, is a logic "0", and the second output signal, QB, is a logic "1". Now consider a situation where the transistor 506 turns on due to an SEE. The SEE may be modeled by a resistive short 528. In this situation, the SEE could potentially change the first output signal, Q, to a logic "1" and thus cause an error.

However, the transistors 502,504,506,520,514,516 are designed in such a way that when all of the above transistors are turned on, the first output signal, Q, will remain at a logic "0". This can be arranged in any of a variety of ways, such as by designing the transistors 520,514,516 to be "stronger" than the transistors 502,504,506 when all of the above transistors are turned on. The transistors 520,514,516 may be designed to be "stronger" than the transistors 502,504,506 by varying channel lengths and/or doping concentrations of any of the above transistors, as examples. Of course, other examples exist for designing the transistors 520,514,516 to be "stronger" than the transistors 502, 504,506 when all of the above transistors are turned on.

Further, one skilled in the art will readily discern that when any one of the transistors 502, 504, 506, 508, 510, 512, 514, 516, 518, and 520 changes state due to an SEE, the first output signal, Q, will maintain its state. And this is true for any combination of the first signal, D, redundant first signal, D*, and clock signal, C. Hence, the first output signal, Q, preferably remains substantially constant when any one of the transistors 502, 504, 506, 508, 510, 512, 514, 516, 518, and 520 changes state due to an SEE. Of course, other examples exist for the radiation-hardened OR-NAND transistor logic 500.

Figure 6:
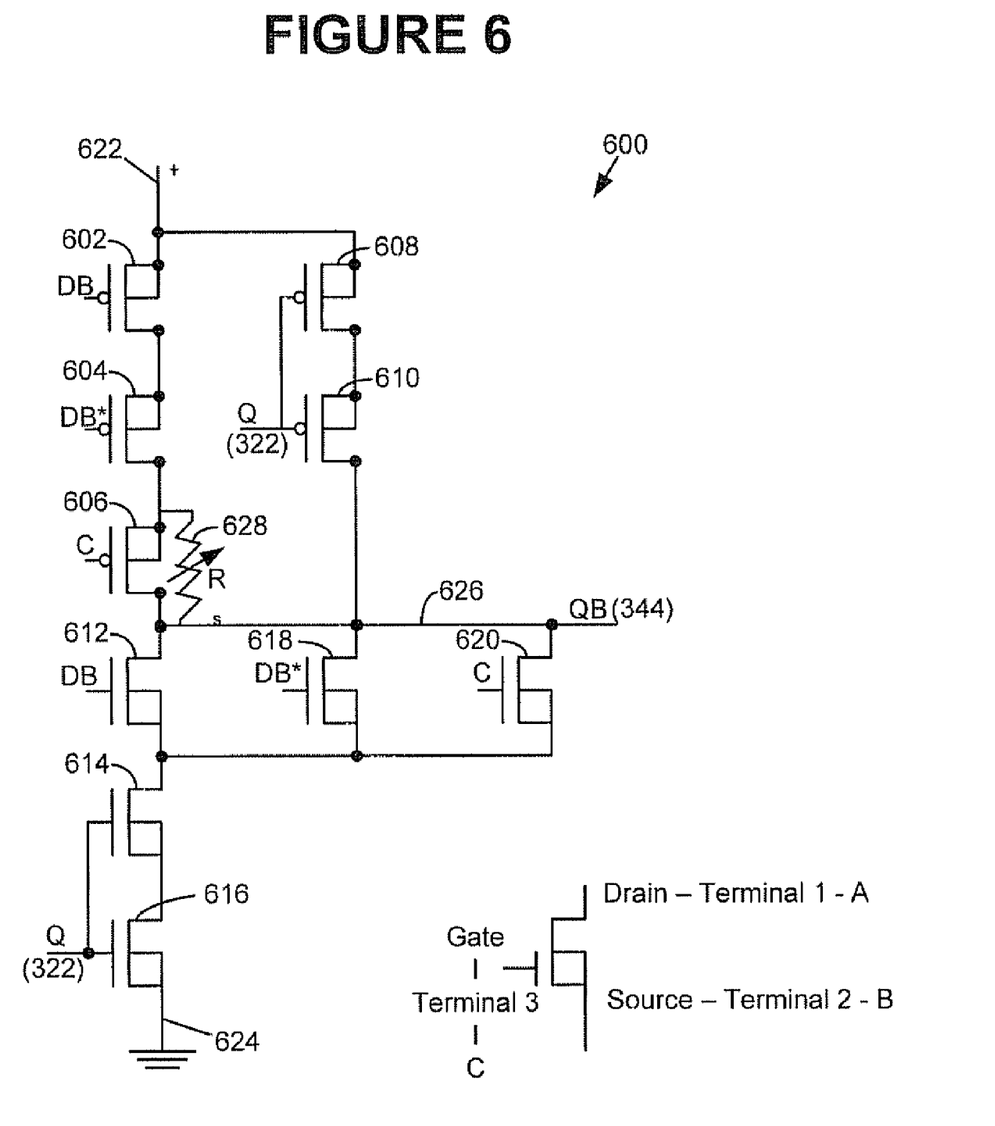
FIG. 6 is a block diagram of radiation-hardened OR-NAND transistor logic, according to an example.

Further, the three-input OR gate 334 and NAND gate 342 are preferably cooperatively radiation hardened as well. FIG. 6 is a block diagram of radiation-hardened OR-NAND transistor logic 600, according to an example. The radiation-hardened OR-NAND transistor logic 600 may be used to cooperatively implement the three-input OR gate 334 and NAND gate 342. As shown, the radiation-hardened OR-NAND transistor logic 600 includes transistors 602, 604, 606, 608, 610, 612, 614, 616, 618, and 620. The radiation-hardened OR-NAND transistor logic 600 may be substantially similar to the radiation-hardened OR-NAND transistor logic 500. Of course, other examples exist for the radiation-hardened OR-NAND transistor logic 600.

Figure 7:
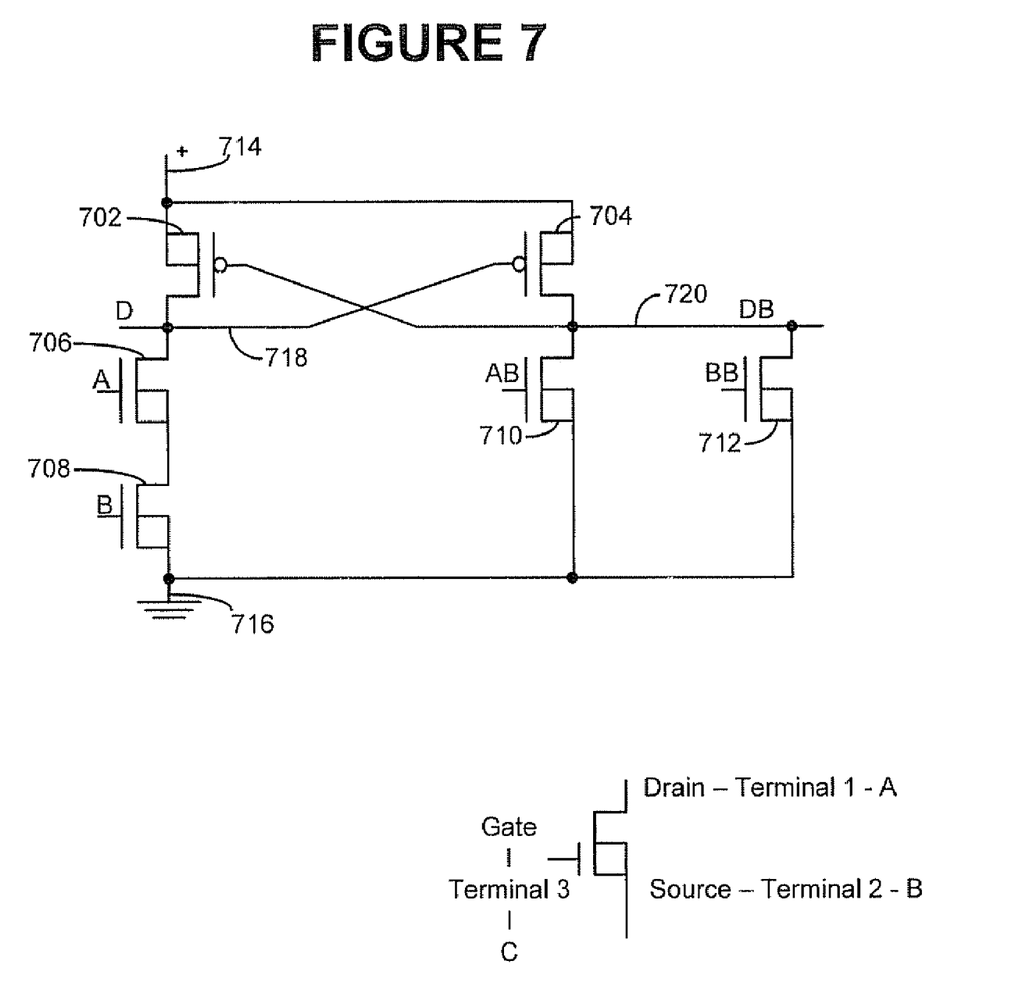
FIG. 7 is a block diagram of a cascade-voltage-switch-logic NAND/AND gate, according to an example.

As noted, the first signal, D, and second signal, DB, are preferably complementary to one another. Put another way, the first signal may be a "true signal" and the second signal may be a "complementary signal." The first signal, D, and second signal, DB, may be produced in any of a variety of ways. FIG. 7 is a block diagram of a cascade-voltage-switch-logic (CVSL) NAND/AND gate 700 for use in producing the first signal, D, and second signal, DB, according to an example. Further details regarding CVSL gates can be found in L. Heller, et. al, "Cascode Voltage Logic . . . ", IEEE International Conference on Solid State Circuits Digest of Technical Papers, Volume XXBII, February 1984, pgs. 16-17, which is hereby incorporated by reference in its entirety.

As shown in FIG. 7, the CVSL NAND/AND gate 700 includes transistors 702, 704, 706, 708, 710, and 712. For the transistor 702, terminal 702b (e.g., a source terminal) is connected to a voltage supply 714, terminal 702c (e.g., a gate terminal) is connected to a signal line 720 that includes the second signal, DB, and terminal 702a (e.g., a drain terminal) is connected to a signal line 718 that includes the first signal, D. For the transistor 704, terminal 704b is connected to the voltage supply 714 (or a separate voltage supply), terminal 704c is connected to the signal line 718, and terminal 704a is connected to the signal line 720. For the transistor 706, terminal 706a is connected to the signal line 718, terminal 706c is connected to a third signal, A, and terminal 706b is connected terminal 708a of the transistor 708.

For the transistor 708, terminal 708a is connected to the terminal 706b of the transistor 706, terminal 708c is connected to a fourth signal, B, and terminal 708b is connected to ground 716. For the transistor 710, terminal 710a is connected the signal line 720, terminal 710c is connected to a fifth signal, AB (also known as A_bar, which is the complement of A), and terminal 710b is connected to ground 716 (or a separate ground). For the transistor 712, terminal 712a is connected to the signal line 720, terminal 712c is connected to a sixth signal, BB (also known as B_bar, which is the complement of B), and terminal 712b is connected to ground 716 (or a separate ground supply).

Figure 8:
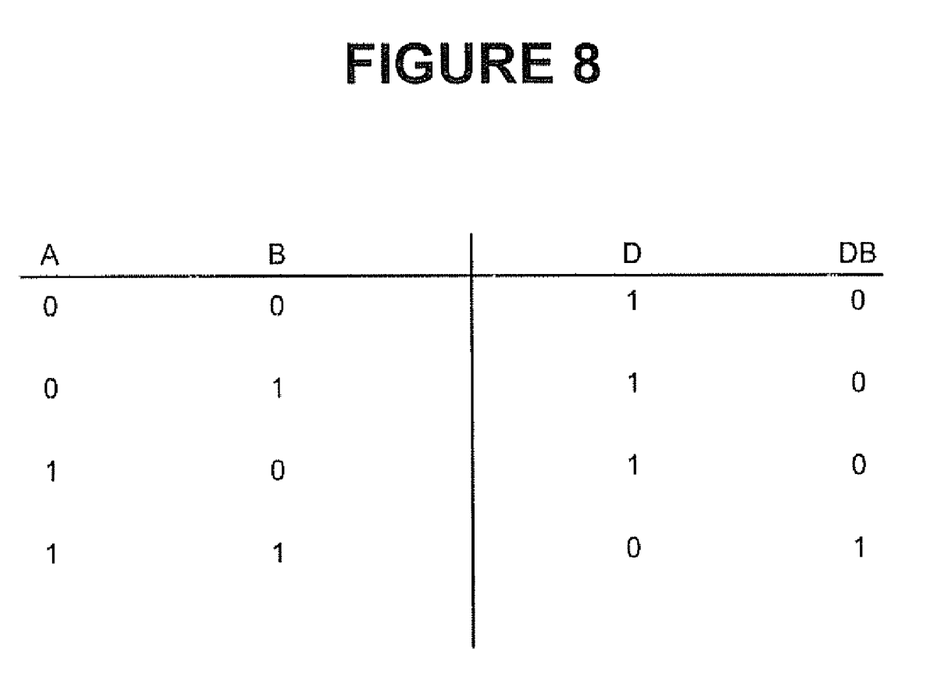
FIG. 8 is a truth table corresponding to the cascade-voltage-switch-logic NAND/AND gate of FIG. 7, according to an example.

The third signal, A, and fifth signal, AB, are preferably complementary to one another. And the fourth signal, B, and sixth signal, BB, are preferably complementary to one another. FIG. 8 is a truth table 800 corresponding to the CVSL NAND/AND gate 700, according to an example. Of course, other examples exist for the CVSL NAND/AND gate 700, and for producing the first signal, D, and second signal, DB.

2. Methodology

Figure 9:
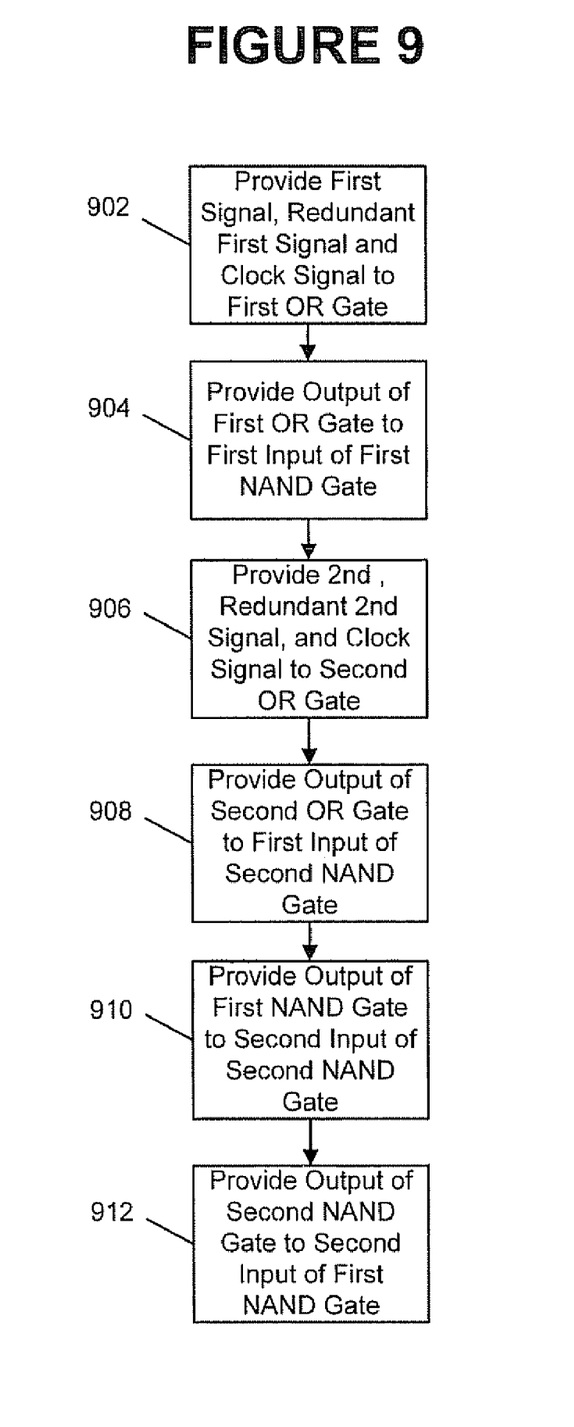
FIG. 9 is a flow chart of a method for operating a clocked latch that is hardened against single event effects, according to an example.

FIG. 9 is a flow chart of a method 900 for operating a clocked latch that is hardened against single event effects, according to an example. Two or more of the functions shown in FIG. 9 may occur substantially simultaneously. Further, not all of the functions shown in FIG. 9 are required in order to carry out the method 900.

At block 902, the method includes providing a first signal (e.g., D), redundant first signal (e.g., D*), and clock signal (e.g., C) to a first three-input OR gate such as three-input OR gate 312. Providing the redundant first signal to the first three-input OR gate may include providing the second signal to a first inverter such as the inverter 304, and providing an output of the first inverter to an input of the first three-input OR gate.

At block 904, the method includes providing an output of the first three-input OR gate to a first input of a first NAND gate such as the NAND gate 320.

At block 906, the method includes providing a second signal (e.g., DB), redundant second signal (e.g., DB*), and the clock signal (e.g., C) to a second three-input OR gate such as three-input OR gate 334. Providing the redundant second signal to the second three-input OR gate may include providing the first signal to a second inverter such as the inverter 326, and providing an output of the second inverter to an input of the second three-input OR gate.

At block 908, the method includes providing an output of the second three-input OR gate to a first input of a second NAND gate such as NAND gate 342.

At block 910, the method includes providing a first output signal (e.g., Q) of the first NAND gate to a second input of the second NAND gate. And at block 912, the method includes providing a second output signal (e.g., QB) of the second NAND gate to a second input of the first NAND gate.

Each of the first and second output signals preferably maintains its state when any one of the first signal, redundant first signal, second signal, redundant second signal, and clock signal changes state due to an SEE.

The first three-input OR gate and first NAND gate may cooperatively include a first plurality of transistors. The first output signal preferably maintains its state when a transistor in the first plurality of transistors changes state due to an SEE. Similarly, the second three-input OR gate and second NAND gate may cooperatively include a second plurality of transistors. The second output signal preferably maintains its state when a transistor in the second plurality of transistors changes state due to an SEE.

The first three-input OR gate and first NAND gate may take any of a variety of configurations. For example, the first three-input OR gate and first NAND gate may cooperatively include first, second, third, fourth, fifth, sixth, seventh, eighth, ninth, and tenth transistors. A second terminal of the first transistor is connected to a first voltage supply; a first terminal of the first transistor is connected to a second terminal of the second transistor; a first terminal the second transistor is connected to a second terminal of the third transistor; a first terminal of the third transistor is connected to a signal line that includes the first output signal; a second terminal of the fourth transistor is connected a second voltage supply; a first terminal of the fourth transistor is connected to a second terminal of the fifth transistor; and the first terminal of the fifth transistor is connected to the signal line.

A first terminal of each of the sixth, ninth, and tenth transistors is connected to the signal line; a second terminal of each of the sixth, ninth, and tenth transistors is connected to a first terminal of the seventh transistor; a second terminal of the seventh transistor is connected to a first terminal of the eighth transistor; and a second terminal of the eighth transistor is connected to ground.

Further, a third terminal of each of the first and sixth transistors is connected to the first signal; a third terminal of each of the second and ninth transistors is connected to the redundant first signal; a third terminal of each of the third and tenth transistors is connected to the clock signal; and a third terminal of each of the fourth, fifth, seventh, and eighth transistors is connected to the second output signal.

The first voltage supply may include the second voltage supply. The first output signal preferably remains substantially constant when any one of the first, second, third, fourth, fifth, sixth, seventh, eighth, ninth, and tenth transistors changes state due to an SEE.

As another example, the second three-input OR gate and second NAND gate may cooperatively include first, second, third, fourth, fifth, sixth, seventh, eighth, ninth, and tenth transistors. A second terminal of the first transistor is connected to a first voltage supply; a first terminal of the first transistor is connected to a second terminal of the second transistor; a first terminal the second transistor is connected to a second terminal of the third transistor; a first terminal of the third transistor is connected to a signal line that includes the second output signal; a second terminal of the fourth transistor is connected a second voltage supply; a first terminal of the fourth transistor is connected to a second terminal of the fifth transistor; and the first terminal of the fifth transistor is connected to the signal line.

A first terminal of each of the sixth, ninth, and tenth transistors is connected to the signal line; a second terminal of each of the sixth, ninth, and tenth transistors is connected to a first terminal of the seventh transistor; a second terminal of the seventh transistor is connected to a first terminal of the eighth transistor; and a second terminal of the eighth transistor is connected to ground.

Further, a third terminal of each of the first and sixth transistors is connected to the second signal; a third terminal of each of the second and ninth transistors is connected to the redundant second signal; a third terminal of each of the third and tenth transistors is connected to the clock signal; and a third terminal of each of the fourth, fifth, seventh, and eighth transistors is connected to the first output signal.

The first voltage supply may include the second voltage supply. The second output signal preferably remains substantially constant when any one of the first, second, third, fourth, fifth, sixth, seventh, eighth, ninth, and tenth transistors changes state due to an SEE.

3. CONCLUSION

Exemplary embodiments of the present invention have been described above. Those skilled in the art will understand, however, that changes and modifications may be made to the embodiments described without departing from the true scope and spirit of the present invention, which is defined by the claims.

I claim:

1. A system for hardening a clocked latch against single event effects, the system comprising:
   a first three-input OR gate;
   a first NAND gate that (i) includes a first input and second input and (ii) produces a first output signal;
   a second three-input OR gate; and
   a second NAND gate that (i) includes a third input and fourth input and (ii) produces a second output signal,
   wherein the first three-input OR gate receives as inputs a clock signal, a first signal, and a redundant first signal, and wherein an output of the first three-input OR gate is connected to the first input of the first NAND gate,
   wherein the second three-input OR gate receives as inputs the clock signal, a second signal, and a redundant second signal, and wherein an output of the second three-input OR gate is connected to the third input of the second NAND gate, and
   wherein the first output signal is connected to the fourth input of the second NAND gate, and wherein the second output signal is connected to the second input of the first NAND gate.

2. The system of claim 1, wherein the first signal and second signal are complementary to one another.

3. The system of claim 1, wherein each of the first output signal and second output signal maintains its state when any one of the first signal, redundant first signal, second signal, redundant second signal, and clock signal changes state due to a single event effect.

4. The system of claim 1, further comprising:
   a first inverter, wherein an output of the first inverter is connected to an input of the first three-input OR gate, and wherein the first inverter receives the second signal as an input and produces the redundant first signal as an output; and
   a second inverter, wherein an output of the second inverter is connected to an input of the second three-input OR gate, and wherein the second inverter receives the first signal as an input and produces the redundant second signal as an output.

5. The system of claim 1, wherein the first three-input OR gate and first NAND gate cooperatively include a first plurality of transistors, and wherein the first output signal maintains its state when a transistor in the first plurality of transistors changes state due to a single event effect; and wherein the second three-input OR gate and second NAND gate cooperatively include a second plurality of transistors, and wherein the second output signal maintains its state when a transistor in the second plurality of transistors changes state due to a single event effect.

6. The system of claim 1, wherein the first three-input OR gate and first NAND gate cooperatively comprise:
   first, second, third, fourth, fifth, sixth, seventh, eighth, ninth, and tenth transistors,
   wherein a second terminal of the first transistor is connected to a first voltage supply, wherein a first terminal of the first transistor is connected to a second terminal of the second transistor, wherein a first terminal the second transistor is connected to a second terminal of the third transistor, wherein a first terminal of the third transistor is connected to a signal line that includes the first output signal, wherein a second terminal of the fourth transistor is connected a second voltage supply, wherein a first terminal of the fourth transistor is connected to a second terminal of the fifth transistor, and wherein the first terminal of the fifth transistor is connected to the signal line,
   wherein a first terminal of each of the sixth, ninth, and tenth transistors is connected to the signal line, wherein a second terminal of each of the sixth, ninth, and tenth transistors is connected to a first terminal of the seventh transistor, wherein a second terminal of the seventh transistor is connected to a first terminal of the eighth transistor, and wherein a second terminal of the eighth transistor is connected to ground, and
   wherein a third terminal of each of the first and sixth transistors is connected to the first signal, wherein a third terminal of each of the second and ninth transistors is connected to the redundant first signal, wherein a third terminal of each of the third and tenth transistors is connected to the clock signal, and wherein a third terminal of each of the fourth, fifth, seventh, and eighth transistors is connected to the second output signal.

7. The system of claim 6, wherein the first output signal remains substantially constant when any one of the first, second, third, fourth, fifth, sixth, seventh, eighth, ninth, and tenth transistors changes state due to a single event effect.

8. The system of claim 1, wherein the second three-input OR gate and second gate cooperatively comprise:
   first, second, third, fourth, fifth, sixth, seventh, eighth, ninth, and tenth transistors,
   wherein a second terminal of the first transistor is connected to a first voltage supply, wherein a first terminal of the first transistor is connected to a second terminal of the second transistor, wherein a first terminal the second transistor is connected to a second terminal of the third transistor, wherein a first terminal of the third transistor is connected to a signal line that includes the second output signal, wherein a second terminal of the fourth transistor is connected a second voltage supply, wherein a first terminal of the fourth transistor is connected to a second terminal of the fifth transistor, and wherein the first terminal of the fifth transistor is connected to the signal line,
   wherein a first terminal of each of the sixth, ninth, and tenth transistors is connected to the signal line, wherein a second terminal of each of the sixth, ninth, and tenth transistors is connected to a first terminal of the seventh transistor, wherein a second terminal of the seventh transistor is connected to a first terminal of the eighth transistor, and wherein a second terminal of the eighth transistor is connected to ground, and wherein a third terminal of each of the first and sixth transistors is connected to the second signal, wherein a third terminal of each of the second and ninth transistors is connected to the redundant second signal, wherein a third terminal of each of the third and tenth transistors is connected to the clock signal, and wherein a third terminal of each of the fourth, fifth, seventh, and eighth transistors is connected to the first output signal.

9. The system of claim 8, wherein the second output signal remains substantially constant when any one of the first, second, third, fourth, fifth, sixth, seventh, eighth, ninth, and tenth transistors changes state due to a single event effect.

10. The system of claim 1, further comprising a cascade-voltage-switch-logic NAND/AND gate that produces the first signal and second signal.

11. The system of claim 10, wherein cascade-voltage-switch-logic NAND/AND gate comprises:
  first, second, third, fourth, fifth, and sixth transistors,
  wherein a second terminal of the first transistor is connected to a first voltage supply, wherein a third terminal of the first transistor is connected to a second signal line that includes the second signal, wherein a first terminal of the first transistor is connected to a first signal line that includes the first signal, wherein a second terminal of the second transistor is connected to a second voltage supply, wherein a third terminal of the second transistor is connected to the first signal line, and wherein a first terminal of the second transistor is connected to the second signal line, and
  wherein a first terminal of the third transistor is connected to the first signal line, wherein a third terminal of the third transistor is connected to a third signal, wherein a second terminal of the third transistor is connected to a first terminal of the fourth transistor, wherein a third terminal of the fourth transistor is connected to a fourth signal, wherein a second terminal of the fourth transistor is connected to a first ground, wherein a first terminal of each of the fifth and sixth transistors is connected to the second signal line, wherein a third terminal of the fifth transistor is connected to a fifth signal, wherein a third terminal of the sixth transistor is connected to a sixth signal, wherein a second terminal of the fifth transistor is connected to a second ground, and wherein a second terminal of the sixth terminal is connected to a third ground.

12. The system of claim 11, wherein the third signal and fifth signal are complementary to one another, and wherein the fourth signal and sixth signal are complementary to one another.

13. A method for operating a clocked latch that is hardened against single event effects, the method comprising:
  providing a first signal, redundant first signal, and clock signal to a first three-input OR gate;
  providing an output of the first three-input OR gate to a first input of a first NAND gate;
  providing a second signal, redundant second signal, and the clock signal to a second three-input OR gate;
  providing an output of the second three-input OR gate to a first input of a second NAND gate;
  providing an output signal of the first NAND gate to a second input of the second NAND gate; and
  providing an output signal of the second NAND gate to a second input of the first NAND gate.

14. The method of claim 13, wherein:
  providing the redundant first signal to the first three-input OR gate comprises providing the second signal to a first inverter and providing an output of the first inverter to an input of the first three-input OR gate, and
  providing the redundant second signal to the second three-input OR gate comprises providing the first signal to a second inverter and providing an output of the second inverter to an input of the second three-input OR gate.

15. The method of claim 13, wherein each of the first output signal and second output signal maintains its state when any one of the first signal, redundant first signal, second signal, redundant second signal, and clock signal changes state due to a single event effect.

16. The method of claim 13, wherein the first three-input OR gate and first NAND gate cooperatively include:
  first, second, third, fourth, fifth, sixth, seventh, eighth, ninth, and tenth transistors,
  wherein a second terminal of the first transistor is connected to a first voltage supply, wherein a first terminal of the first transistor is connected to a second terminal of the second transistor, wherein a first terminal the second transistor is connected to a second terminal of the third transistor, wherein a first terminal of the third transistor is connected to a signal line that includes the first output signal, wherein a second terminal of the fourth transistor is connected a second voltage supply, wherein a first terminal of the fourth transistor is connected to a second terminal of the fifth transistor, and wherein the first terminal of the fifth transistor is connected to the signal line,
  wherein a first terminal of each of the sixth, ninth, and tenth transistors is connected to the signal line, wherein a second terminal of each of the sixth, ninth, and tenth transistors is connected to a first terminal of the seventh transistor, wherein a second terminal of the seventh transistor is connected to a first terminal of the eighth transistor, and wherein a second terminal of the eighth transistor is connected to ground, and
  wherein a third terminal of each of the first and sixth transistors is connected to the first signal, wherein a third terminal of each of the second and ninth transistors is connected to the redundant first signal, wherein a third terminal of each of the third and tenth transistors is connected to the clock signal, and wherein a third terminal of each of the fourth, fifth, seventh, and eighth transistors is connected to the second output signal.

17. The system of claim 16, wherein the first output signal remains substantially constant when any one of the first, second, third, fourth, fifth, sixth, seventh, eighth, ninth, and tenth transistors changes state due to a single event effect.

18. The method of claim 13, wherein the second three-input OR gate and second NAND gate cooperatively include:
  first, second, third, fourth, fifth, sixth, seventh, eighth, ninth, and tenth transistors,
  wherein a second terminal of the first transistor is connected to a first voltage supply, wherein a first terminal of the first transistor is connected to a second terminal of the second transistor, wherein a first terminal the second transistor is connected to a second terminal of the third transistor, wherein a first terminal of the third transistor is connected to a signal line that includes the second output signal, wherein a second terminal of the fourth transistor is connected a second voltage supply, wherein a first terminal of the fourth transistor is connected to a second terminal of the fifth transistor, and wherein the first terminal of the fifth transistor is connected to the signal line,
  wherein a first terminal of each of the sixth, ninth, and tenth transistors is connected to the signal line, wherein a second terminal of each of the sixth, ninth, and tenth transistors is connected to a first terminal of the seventh transistor, wherein a second terminal of the seventh transistor is connected to a first terminal of the eighth transistor, and wherein a second terminal of the eighth transistor is connected to ground, and wherein a third terminal of each of the first and sixth transistors is connected to the second signal, wherein a third terminal of each of the second and ninth transistors is connected to the redundant second signal, wherein a third terminal of each of the third and tenth transistors is connected to the clock signal, and wherein a third terminal of each of the fourth, fifth, seventh, and eighth transistors is connected to the first output signal.

19. The method of claim 18, wherein the second output signal remains substantially constant when any one of the first, second, third, fourth, fifth, sixth, seventh, eighth, ninth, and tenth transistors changes state due to a single event effect.

20. A system for hardening a clocked latch against single event effects, the system comprising:
- a first three-input OR gate that receives as inputs a first signal, a redundant first signal, and a clock signal;
- a second three input OR gate that receives as inputs a second signal, a redundant second signal, and the clock signal; and
- a NAND-based latch that receives as inputs an output of the first three-input OR gate and an output of the second three-input OR gate.

* * * * *